United States Patent
Park et al.

(10) Patent No.: US 9,260,260 B2
(45) Date of Patent: Feb. 16, 2016

(54) IMAGE FORMING APPARATUS, METHOD OF CONTROLLING PAPER FEEDING THEREOF, AND COMPUTER-READABLE RECORDING MEDIUM

(71) Applicant: Samsung Electronics Co., Ltd, Suwon-si, Gyeonggi-do (KR)

(72) Inventors: Young-kook Park, Suwon-si (KR); Ki-young Lee, Hwaseong-si (KR); Kang-seok Kim, Suwon-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 14/340,927

(22) Filed: Jul. 25, 2014

(65) Prior Publication Data
US 2015/0203305 A1    Jul. 23, 2015

(30) Foreign Application Priority Data
Jan. 23, 2014  (KR) .................. 10-2014-0008514

(51) Int. Cl.
| B65H 1/14 | (2006.01) |
| G01R 19/00 | (2006.01) |
| B65H 3/06 | (2006.01) |
| B65H 7/02 | (2006.01) |
| B65H 1/04 | (2006.01) |

(52) U.S. Cl.
CPC .. B65H 1/14 (2013.01); B65H 3/06 (2013.01); B65H 7/02 (2013.01); G01R 19/0092 (2013.01); *B65H 1/04* (2013.01); *B65H 2513/22* (2013.01); *B65H 2513/512* (2013.01); *B65H 2515/702* (2013.01); *B65H 2515/704* (2013.01)

(58) Field of Classification Search
CPC .............. B65H 1/08; B65H 1/14; B65H 1/18; B65H 2405/353; B65H 2407/50; B65H 2515/704; B65H 2515/706; B65H 2515/708
See application file for complete search history.

(56) References Cited

U.S. PATENT DOCUMENTS

| 2002/0140159 A1* | 10/2002 | Dobbertin et al. ............. 271/207 |
| 2006/0087070 A1* | 4/2006 | Cook et al. .................... 271/145 |
| 2009/0121412 A1 | 5/2009 | Koyanagi |

FOREIGN PATENT DOCUMENTS

| JP | 2003-137446 | 5/2003 |
| JP | 2010-195501 | 9/2010 |
| JP | 2012-062127 | 3/2012 |
| JP | 2012-91917 | 5/2012 |
| JP | 2012-096855 | 5/2012 |
| JP | 2012-106812 | 6/2012 |

OTHER PUBLICATIONS

Machine translation of JP 2003-137446 A, retrieved Mar. 29, 2015.*
International Search Report and Written Opinion of the International Searching Authority issued Nov. 17, 2014 in International Patent Application No. PCT/KR2014/006676.
Extended European Search Report dated Jun. 26, 2015 from European Patent Application No. 15150985.8, 6 pages.

* cited by examiner

*Primary Examiner* — Michael McCullough
(74) *Attorney, Agent, or Firm* — Staas & Halsey LLP (57) ABSTRACT

An image forming apparatus, a method of controlling paper feeding thereof, and a computer-readable recording medium containing code to perform the method. The image forming apparatus includes a lift configured to supply loaded paper to a feed roller, a motor configured to move the lift so that the paper reaches and contacts the feed roller, a sensor configured to measure current that flows through the motor, and a controller configured to control driving of the motor according to a measured level of the current.

20 Claims, 7 Drawing Sheets

IMAGE FORMING APPARATUS, METHOD OF CONTROLLING PAPER FEEDING THEREOF, AND COMPUTER-READABLE RECORDING MEDIUM

CROSS-REFERENCE TO RELATED APPLICATIONS

This application claims priority under 35 U.S.C. §119(a) to Korean Patent Application No. 10-2014-0008514, filed on Jan. 23, 2014, in the Korean Intellectual Property Office, the disclosure of which is incorporated herein by reference.

BACKGROUND OF THE INVENTION

1. Field of the Invention

The present disclosure relates to an image forming apparatus, a method of controlling paper feeding thereof, and a computer-readable recording medium, and more particularly to an image forming apparatus, a method of controlling paper feeding thereof, and a computer-readable recording medium, which can sense output current of a motor to drive a lift without using a sensor, such as a micro switch or a photo-interrupter, and can stop the driving of the motor in the case where a printing paper is sufficiently lifted to reach a feed roller.

2. Description of the Related Art

Recently, with the development of electronic technology, various types of image forming apparatuses, such as a printer, a scanner, a copy machine, a facsimile, and a multifunctional peripheral (MFP) having at least two functions of the above-described devices, have been used on a widespread scale.

In order to perform a printing operation according to a user's command, it is necessary to make printing paper loaded in a paper tray contact a feed roller that feeds the paper to an image former. This function is performed by a motor that moves a lift, such as knock-up type device, in a direction of the feed roller.

If the lift is moved by the motor enough to make the paper contact the feed roller, it is necessary to stop the driving of the motor so that the paper is prevented from being lifted any further in the direction of the feed roller. In the related art, this function is performed by a micro switch or a photo-interrupter.

Figure 1:
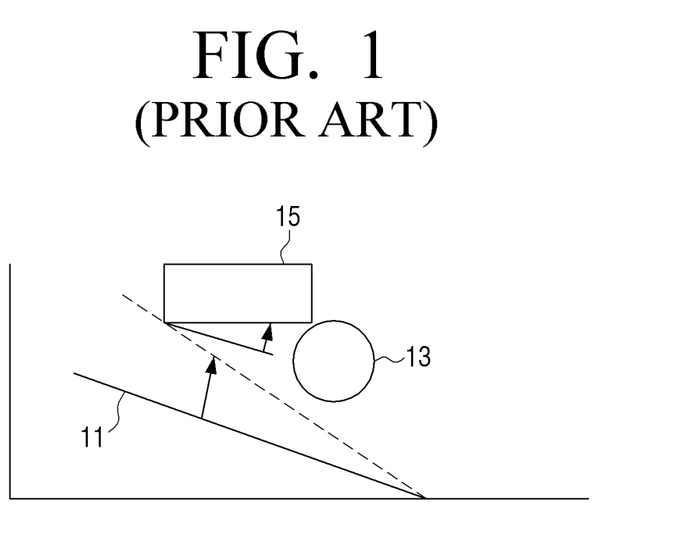
FIG. 1 is a diagram explaining a method of controlling driving of a motor that moves a lift using a micro switch in the related art.

FIG. 1 is a diagram explaining a method of controlling driving of a motor using a micro switch in the related art.

If printing paper is lifted enough to reach a feed roller 13 by a lift 11, such as by use of a knock-up device, the paper causes a switch 15 to be turned on. If the switch 15 is turned on, a motor that moves the lift 1 is stopped, and thus the paper is not lifted any further in the direction of the feed roller 13.

However, if the location of the paper is sensed using a separate sensor, such as the micro switch or photo-interrupter, as described above, material costs increase due to installation of such a sensor, and this causes an increase in product costs.

Further, if the switch is short-circuited or an error occurs due to the secession of an actuator, the motor may be overloaded, and this may cause deterioration of the durability of the components including the motor and the occurrence of the malfunction/missing steps of the motor.

Accordingly, there is a need for a method capable of controlling the motor through sensing of the location of the lift that lifts the paper without providing a separate sensor.

SUMMARY OF THE INVENTION

The present disclosure addresses at least the above problems and/or disadvantages and provides at least the advantages described below. Accordingly, features of the present disclosure provide an image forming apparatus, a method of controlling paper feeding thereof, and a computer-readable recording medium, which can sense current that is applied to a motor that moves a lift and can control the driving of the motor so that the lift is not moved any further or the lifting speed of the lift is decreased if it is determined that the lift is sufficiently moved.

Additional features and utilities of the present general inventive concept will be set forth in part in the description which follows and, in part, will be obvious from the description, or may be learned by practice of the general inventive concept.

Exemplary embodiments of the present disclosure provide an image forming apparatus which includes a lift configured to supply loaded paper to a feed roller; a motor configured to move the lift so that the paper reaches and contacts the feed roller; a sensor configured to measure current that flows through the motor; and a controller configured to control driving of the motor according to a measured level of the current.

In an exemplary embodiment, the image forming apparatus according to an exemplary embodiment of the present disclosure may further include a resistor portion configured to detect the current as a voltage, wherein if the level of the voltage exceeds a preset reference value, the controller stops the driving of the motor or decreases a driving speed of the motor.

In an exemplary embodiment, the controller may stop the driving of the motor if the level of the current exceeds a preset reference value.

In an exemplary embodiment, the controller may decrease a driving speed of the motor so that the level of the current becomes equal to or lower than a preset reference value if the level of the current exceeds a preset reference value.

In an exemplary embodiment, the controller may count the number of sheets of the paper being supplied to the feed roller and may control the motor so that the lift ascends in a direction of the feed roller whenever a preset number of sheets of the paper are supplied.

In an exemplary embodiment, the number of sheets of the paper may differ depending on at least one of a thickness, a weight, and a material of the paper.

In an exemplary embodiment, the image forming apparatus may further include an interceptor configured to generate a signal for stopping the driving of the motor if the current exceeds a preset level.

Exemplary embodiments of the present disclosure also provide a method of controlling paper feeding of an image forming apparatus which includes moving a lift so that loaded paper reaches and contacts a feed roller; measuring current that flows through a motor that moves the lift; and controlling driving of the motor according to a measured level of the current.

In an exemplary embodiment, the method of controlling paper feeding according to an exemplary embodiment may further include detecting the current as a voltage, wherein if the level of the voltage exceeds a preset reference value, the driving of the motor is stopped or a driving speed of the motor is decreased.

In an exemplary embodiment, the controlling the driving of the motor may include stopping the driving of the motor if the level of the current exceeds a preset reference value.

In an exemplary embodiment, the controlling the driving of the motor may include decreasing a driving speed of the motor so that the level of the current becomes equal to or lower than a preset reference value if the level of the current exceeds a preset reference value.

In an exemplary embodiment, the method of controlling paper feeding may further include counting the number of sheets of the paper being supplied to the feed roller; and controlling the motor so that the lift ascends in a direction of the feed roller whenever a preset number of sheets of the paper are supplied.

In an exemplary embodiment, the number of sheets of the paper may differ depending on at least one of a thickness, a weight, and a material of the paper.

In an exemplary embodiment, the method of controlling paper feeding may further include generating a signal for stopping the driving of the motor if the current exceeds a preset reference value.

Exemplary embodiments of the present disclosure may also provide a computer-readable recording medium including a program for executing a method for controlling paper feeding of an image forming apparatus is provided, wherein the method of controlling paper feeding includes moving a lift so that loaded paper reaches and contacts a feed roller; measuring current that flows through a motor that moves the lift; and controlling driving of the motor according to a measured level of the current.

Exemplary embodiments of the present disclosure may also provide an image forming apparatus comprising: a lift configured to supply loaded paper to a feed roller; a motor configured to move the lift so that the paper reaches and contacts the feed roller; a sensor configured to measure current that flows through the motor; and an interceptor to output an enable signal to control driving of the motor according to a measured level of the current.

In an exemplary embodiment, the sensor outputs a sensed voltage in response to the current measured, and the interceptor outputs the enable signal based on a comparison of the sensed voltage and a preset reference voltage.

In an exemplary embodiment, the interceptor comprises: a low pass filter to receive the sensed voltage; and a comparator to receive the sensed voltage from the low pass filter and compare the sensed voltage to the preset voltage.

In an exemplary embodiment, the image forming apparatus further comprises a controller configured to also control driving of the motor according to a measured level of the current.

In an exemplary embodiment, the image forming apparatus further comprises a driver to receive the enable signal from the interceptor to stop the driving of the motor and/or receive a pulse width modulation signal from the controller to control the driving of the motor.

According to the image forming apparatus and the method of controlling paper feeding as described above, the existing limit sensor, such as the micro switch or photo-interrupter, is not used, and thus the manufacturing cost can be reduced.

Further, the lift may be operated according to the number of sheets of paper, and thus the gap between the paper and the feed roller can be flexibly adjusted. In addition, the problems of durability deterioration, such as missing steps of the motor, loss of gear teeth, and coil deterioration, which are caused by the malfunction of the limit sensor, can be solved.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Figure 2:
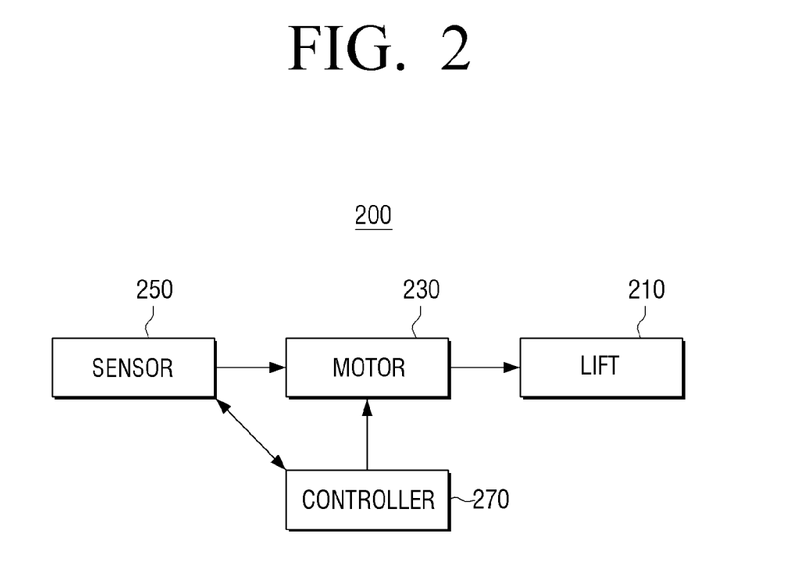
FIG. 2 is a block diagram illustrating the configuration of an image forming apparatus according to an embodiment of the present disclosure.

FIG. 2 is a block diagram illustrating the configuration of an image forming apparatus according to an embodiment of the present disclosure. Referring to FIG. 2, an image forming apparatus 200 includes a lift 210, a motor 230, a sensor 250, and a controller 270.

FIG. 2 illustrates only the constituent elements related to this embodiment. Accordingly, it can be understood by those of ordinary skill in the art to which the present disclosure pertains that other general constituent elements may be further included in addition to the constituent elements illustrated in FIG. 2.

The lift 210 supplies paper loaded in a tray to a feed roller. The lift 210 may be implemented in a knock-up form, and serves to lift the paper so that the paper loaded in the tray reaches and contacts the feed roller.

The motor 230 moves the lift 210 so that the paper contacts the feed roller. The motor 230 may be driven by a driver circuit (not illustrated) that generates a driving voltage in response to a PWM control signal that passes through an LPF (Low Pass Filter).

On the other hand, if the motor 230 moves the lift 210, and the paper loaded on the lift 210 contacts the feed roller or the lift 210 reaches a limit (elastic body or mechanical part formed of a spring, sponge, or rubber) that is installed to prevent the lift 210 from further ascending, the load of the motor 230 that drives the lift 210 is increased.

Further, a counter electromotive force that is generated by the motor 230 is changed depending on the level of the load of the motor 230, and such a change of the counter electromotive force exerts an influence on the current that flows through the motor 230. That is, as the load of the motor 230 is increased, the current that flows to the motor 230 is also increased.

The sensor 250 measures the level of the current that flows to the motor as follows.

In a normal state, it is measured that a predetermined level of current flows to the motor. However, if the lift 210 reaches a limit point, the load of the motor 230 that drives the lift 210 is increased, and thus the level of the current that flows to the motor 230 is also increased.

The controller 270 controls the motor 230 according to the current value that is measured through the sensor 250. Specifically, if the current that is applied to the motor 230 exceeds a preset value, it is determined that the paper loaded on the lift 210 reaches the feed roller and thus the lift 210 is unable to ascend any further. In this case, the driving of the motor 230 may be stopped, or the driving speed of the motor 230 may be lowered until the current that is applied to the motor 230 is lowered below a preset value.

On the other hand, as the paper that is loaded on the lift 210 is supplied to an image former through the feed roller, a gap between the paper and the feed roller becomes large. In this case, the controller 270 may count the number of sheets of the paper that is supplied to the feed roller, and may drive the motor 230 so that the lift 210 ascends in the direction of the feed roller whenever a preset number of sheets of the paper are supplied.

For example, if the preset number of sheets of the paper is 10, the motor 230 may be controlled to move the lift 210 upward whenever 10 sheets of paper are supplied to the image former through the feed roller. In this embodiment, it is exemplified that the preset number of sheets of paper is 10. However, the preset number of sheets of paper may differ depending on the type, thickness, weight, or material of the paper being loaded in the tray.

That is, as the thickness or weight of the paper becomes larger, a smaller number of sheets of paper may be set as the preset number, or a different number of sheets of paper may be preset in consideration of an erroneous setting and the minimum number of sheets of paper being fed according to the design of the feed roller that may be changed depending on the characteristics of the apparatus. In this case, the image forming apparatus 200 may further include at least one of a regi-sensor and a feed sensor to count the number of sheets of paper being supplied.

In this embodiment, it is exemplified that the controller 270 controls the motor 230 to lift the paper loaded on the lift 210 in the direction of the feed roller. However, the motor 230 may be controlled to make the paper move away from the feed roller in consideration of the gap between the feed roller and the paper.

As described above, if the driving of the motor 230 is controlled according to the level of the current that is applied to the motor 230, it becomes possible to control the motor that moves the lift 210 in the direction of the feed roller without the necessity of a separate sensor.

Figure 3:
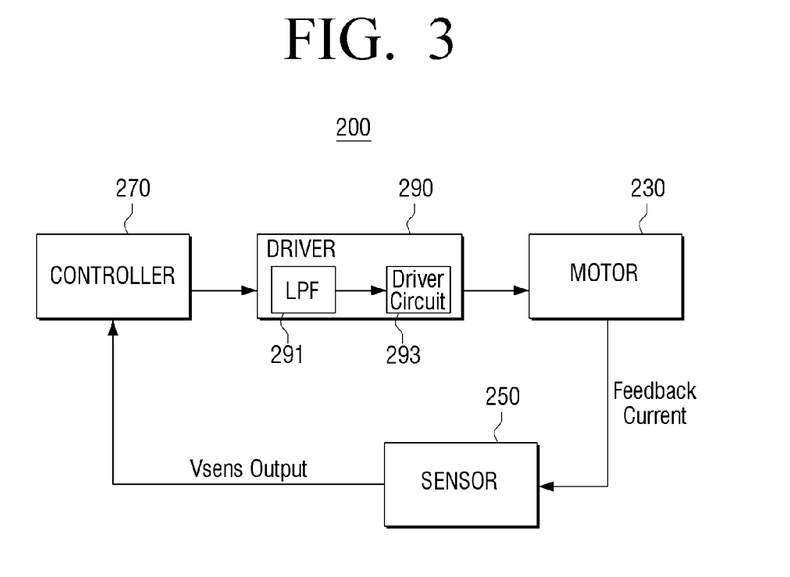
FIG. 3 is a block diagram illustrating the detailed configuration of an image forming apparatus according to an embodiment of the present disclosure.

FIG. 3 is a block diagram illustrating the detailed configuration of an image forming apparatus according to an embodiment of the present disclosure.

The image forming apparatus 200 of FIG. 3 may further include a driver 290 that supplies a voltage Vref of a predetermined level, which corresponds to a PWM (pulse-width-modulation) signal that has passed through a LPF (low pass filter) 291, to the motor. If a limit is set on the lift 210 that lifts a feeder on which paper is loaded in the direction of the feed roller using a mechanical limit guide having a roller and the like, the load of the motor 230 that moves the lift 210 is increased at a moment when the paper loaded on the feeder reaches the limit.

The level of the load that is loaded on the motor 230 exerts an influence on the level of the counter electromotive force generated by the motor, and the change of the counter electromotive force exerts an influence on the current that flows to the motor. The sensor 250 monitors the current that flows through a motor coil and outputs a sensed voltage to the controller 270.

The controller 270 determines whether the paper loaded on the feeder reaches the limit that is preset on the feeder roller using the sensed voltage. Specifically, if the paper reaches the limit of the feeder roller, the load of the motor 230 is increased so as to increase the counter electromotive force, and thus the current that flows through the coil of the motor 230 is increased. The controller 270 may control the driving of the motor 230 according to the level of the current that flows to the motor 230. For example, if the level of the current that flows to the motor 230 is higher than a preset reference value regardless of a motor stop signal, the driving of the motor 230 may be immediately stopped or the driving speed of the motor 230 may be controlled.

Figure 4:
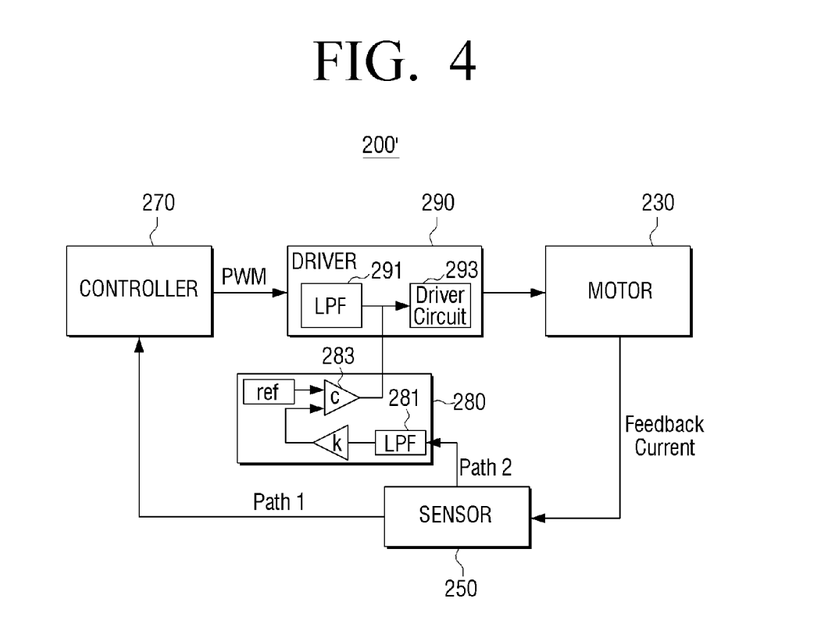
FIG. 4 is a diagram explaining an image forming apparatus that further includes a protection circuit to stop the driving of a motor if current that is applied to the motor exceeds a preset reference value.

FIG. 4 is a diagram explaining an image forming apparatus 200' that further includes a protection circuit to stop the driving of a motor if current that is applied to the motor exceeds a preset reference value.

Typically, the controller 270 stops the motor or decreases the driving speed through a decrease of the PWM signal. On the other hand, the image forming apparatus may further include a comparison circuit that compares the sensed voltage received by the sensor 250 with a preset reference voltage regardless of the motor stop signal that is generated by the controller 270. If the current that is applied to the motor 230 exceeds the reference value, the comparison circuit may output an enable signal to stop the driving of the motor.

Specifically, if the controller 270 outputs a PWM control signal to drive the motor 230, the PWM control signal is transferred to the motor 230 through the LPF 291 and the driver circuit 293. Thereafter, the sensor 250 may measure the current that flows through the coil of the motor 230, and may transfer the sensed voltage to the controller 270 or the interceptor 280.

An explanation of path 1 through which the sensor 250 transfers the sensed voltage to the controller 270 is the same as that with reference to FIG. 3, and in this embodiment, only a process in which the sensor 250 transfers the sensed voltage to the interceptor 280 will be described.

If the sensor 250 transfers the sensed voltage obtained as a result of the measured feedback current of the motor 230 to the interceptor 280, the sensed voltage is transferred to a comparator 283 through the LPF 281. The comparator 283 compares the sensed voltage received from the sensor 250 with the preset reference value, and if it is determined that the sensed voltage is higher than the preset reference value, the comparator 283 outputs the enable signal to stop the driving of the motor to the driver 290.

That is, in the case where the sensed voltage provided by the sensor 250 is higher than the preset reference value, the paper loaded on the feeder moves enough to sufficiently reach the feed roller, and in this case, if the feeder further moves in the direction of the feed roller, the load that is applied to the motor 230 is increased. In this case, the interceptor 280 generates the enable signal to stop the operation of the motor 230.

As described above, if the operation of the motor 230 is controlled by the enable signal of the interceptor 280 without using the controller 270, the driving of the motor 230 can be stopped more rapidly at a required time.

Figure 5:
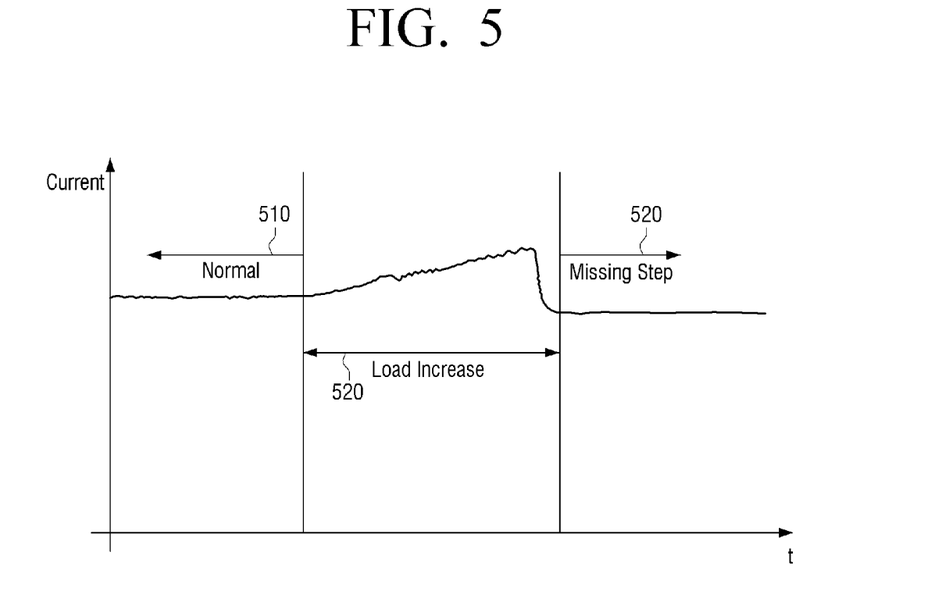
FIG. 5 is a diagram explaining feedback current that is measured in a motor according to an embodiment of the present disclosure.

FIG. 5 is a diagram explaining feedback current that is measured in a motor according to an embodiment of the present disclosure.

In a normal region 510, the motor 230 move the lift 210 to lift the paper loaded on the feeder toward the feed roller. At this time, the load that is applied to the motor 230 is constant, and thus constant feedback current is measured from the motor 230.

On the other hand, if the lift 210 sufficiently ascends and the paper loaded on the feeder reaches the limit in a load increase region 520, the load that is applied to the motor 230 is increased, and thus a higher feedback current is measured. In this case, if the feedback current of the motor 230 reaches the preset reference value, the controller 270 may stop the driving of the motor 230 or decrease the driving speed of the motor 230, resulting in that the lift 210 does not ascend any further in the direction of the feed roller.

If the motor 230 is continuously driven although the lift 210 has sufficiently ascended in the direction of the feed roller, missing steps may occur and the motor 230 may operate in an abnormal state. In a missing step region 530, feedback current having a different level from that of the feedback current in the normal region 510 is detected.

As described above, if the feedback current of the motor 230 is measured and the driving of the motor 230 is controlled based on the measured feedback current, the paper can be efficiently supplied even without the limit sensor, such as the micro switch or photo-interrupter.

Figure 6:
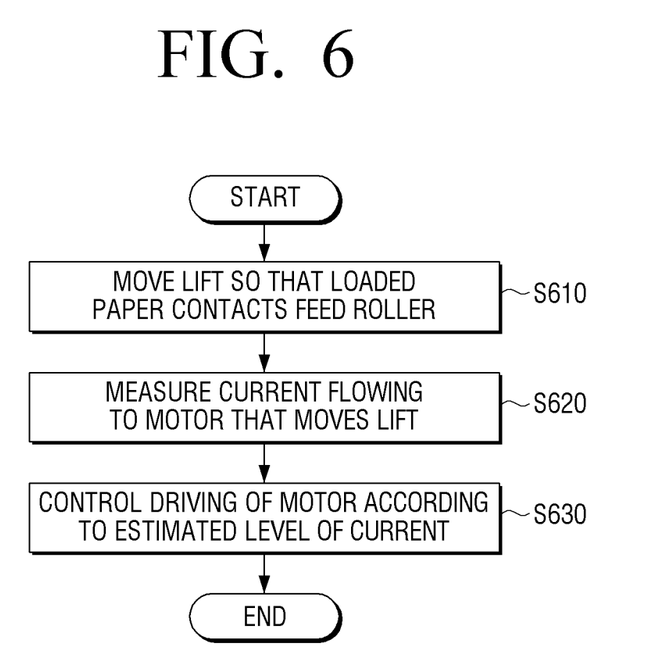
FIG. 6 is a flowchart illustrating a method of controlling paper feeding of an image forming apparatus according to an embodiment of the present disclosure.

FIG. 6 is a flowchart illustrating a method of controlling paper feeding of an image forming apparatus according to an embodiment of the present disclosure.

The paper loaded on the feeder is moved in the direction of the feed roller by the lift (operation S610). Then, the current flowing to the motor that drives the lift is measured (operation S620). The current that flows to the motor differs depending on the counter electromotive force that is generated from the motor. For example, if the motor moves the lift although the paper is sufficiently moved in the direction of the feed roller and is unable to be moved any further, the load of the motor is increased to increase the counter electromotive force, and thus the current that flows to the motor is increased.

If the motor is controlled according to the measured level of the current (operation S630), the lift can be controlled according to the location of the feeder even without a separate switch for controlling the driving of the lift.

In this embodiment, it is described that the driving of the motor is controlled through measurement of the current that flows to the motor. However, a resistor portion to convert the current that flows to the motor into a voltage may be further included to control the driving of the motor according to the level of the voltage.

Figure 7:
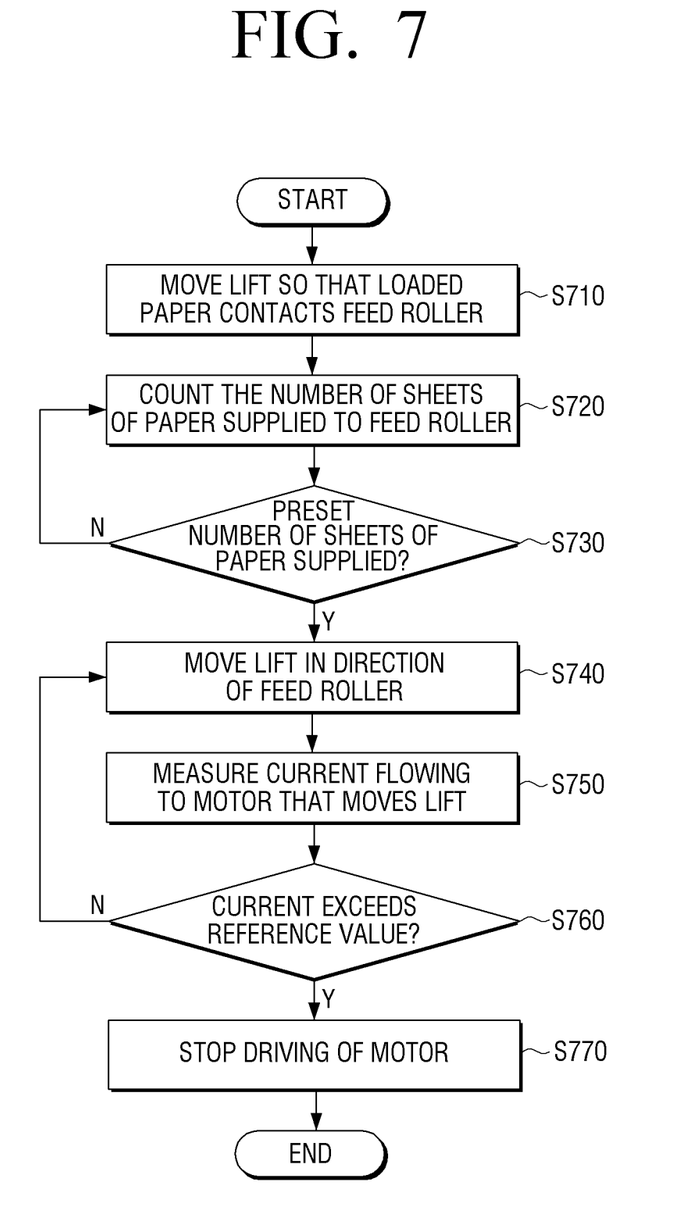
FIG. 7 is a flowchart illustrating a method of controlling paper feeding of an image forming apparatus according to another embodiment of the present disclosure.

FIG. 7 is a flowchart illustrating a method of controlling paper feeding of an image forming apparatus according to another embodiment of the present disclosure.

The paper loaded on the feeder is moved in the direction of the feed roller by the lift (operation S710). If the paper loaded on the feeder is sufficiently moved to reach the feed roller, the paper is supplied to the feed roller, and the number of sheets of paper that is supplied to the feed roller is counted (operation S720).

As the paper is supplied to the feed roller, the gap between the paper and the feed roller becomes large, and the motor is controlled so that the lift ascends in the direction of the feed roller (operation S740) whenever a predetermined number of sheets of the paper are supplied to the feed roller (operation S730). In this case, the predetermined number of sheets of paper may be changed depending on the thickness, weight, and material of the paper.

Further, in the same manner as that described referring to FIG. 6, the current that flows to the motor is measured (operation S750). If the motor moves the lift although the paper is sufficiently moved in the direction of the feed roller, the load of the motor is increased. In this case, if the current that flows to the motor exceeds the preset reference value (operation S760), the driving of the motor is stopped so that the lift does not ascend any further (operation S770).

As described above, if the driving of the motor is controlled according to the level of the current, a separate switch to control the driving of the motor is not required, and thus the manufacturing cost can be lowered. Further, since the location of the lift is adjusted according to the gap between the paper and the feed roller, the paper can be supplied more efficiently.

On the other hand, the above-described method can be performed by a program that is executable in a computer and can be implemented in a general digital computer that operates the program using a computer-readable recording medium. Further, the structure of data used in the above-described method may be recorded on a recording medium through various means. The computer-readable recording medium includes storage medium, such as a magnetic storage medium (e.g., ROM, floppy disk, or hard disk) or an optical reading medium (e.g., CD-ROM, or DVD).

While the present disclosure has been shown and described with reference to certain embodiments thereof, it will be understood by those skilled in the art that various changes in form and detail may be made therein without departing from the spirit and scope of the present disclosure, as defined by the appended claims.

What is claimed is:

1. An image forming apparatus comprising:
   a lift configured to supply loaded paper to a feed roller;
   a motor configured to move the lift so that the paper reaches and contacts the feed roller;
   a sensor configured to measure current that flows through the motor; and
   a controller configured to stop driving of the motor based on a result of comparing a measured level of the current with a preset reference value related to a point in time when the paper reaches and contacts the feed roller and then stops.

2. The image forming apparatus as claimed in claim 1, further comprising a resistor portion configured to detect the current as a voltage,
   wherein if the level of the voltage exceeds the preset reference value, the controller stops the driving of the motor or decreases a driving speed of the motor.

3. The image forming apparatus as claimed in claim 1, wherein the controller stops the driving of the motor if the level of the current exceeds the preset reference value.

4. The image forming apparatus as claimed in claim 1, wherein the controller decreases a driving speed of the motor so that the level of the current becomes equal to or lower than the preset reference value if the level of the current exceeds the preset reference value.

5. The image forming apparatus as claimed in claim 1, wherein the controller counts the number of sheets of the paper being supplied to the feed roller and controls the motor so that the lift ascends in a direction of the feed roller whenever a preset number of sheets of the paper are supplied.

6. The image forming apparatus as claimed in claim 5, wherein the number of sheets of the paper differs depending on at least one of a thickness, a weight, and a material of the paper.

7. The image forming apparatus as claimed in claim 1, further comprising:
   an interceptor configured to generate a signal to stop the driving of the motor if the current exceeds a preset level.

8. A method of controlling paper feeding of an image forming apparatus, the method comprising:
    moving a lift so that loaded paper reaches and contacts a feed roller;
    measuring current that flows through a motor that moves the lift; and
    stopping driving of the motor based on a result of comparing a measured level of the current with a preset reference value related to a point in time when the paper reaches and contacts the feed roller and then stops.

9. The method of controlling paper feeding as claimed in claim 8, further comprising:
    detecting the current as a voltage,
        wherein if the level of the voltage exceeds the preset reference value, the driving of the motor is stopped or a driving speed of the motor is decreased.

10. The method of controlling paper feeding as claimed in claim 8, wherein the controlling the driving of the motor comprises stopping the driving of the motor if the level of the current exceeds the preset reference value.

11. The method of controlling paper feeding as claimed in claim 8, wherein the controlling the driving of the motor comprises decreasing a driving speed of the motor so that the level of the current becomes equal to or lower than the preset reference value if the level of the current exceeds the preset reference value.

12. The method of controlling paper feeding as claimed in claim 8, further comprising:
    counting the number of sheets of the paper being supplied to the feed roller; and
    controlling the motor so that the lift ascends in a direction of the feed roller whenever a preset number of sheets of the paper are supplied.

13. The method of controlling paper feeding as claimed in claim 12, wherein the number of sheets of the paper differs depending on at least one of a thickness, a weight, and a material of the paper.

14. The method of controlling paper feeding as claimed in claim 8, further comprising:
    generating a signal to stop the driving of the motor if the current exceeds the preset reference value.

15. A non-transitory computer-readable recording medium including a program to execute a method of controlling paper feeding of an image forming apparatus that comprises:
    moving a lift so that loaded paper reaches and contacts a feed roller;
    measuring current that flows through a motor that moves the lift; and
    stopping driving of the motor based on a result of comparing a measured level of the current with a preset reference value related to a point in time when the paper reaches and contacts the feed roller and then stops.

16. An image forming apparatus comprising:
    a lift configured to supply loaded paper to a feed roller;
    a motor configured to move the lift so that the paper reaches and contacts the feed roller;
    a sensor configured to measure current that flows through the motor; and
    an interceptor to output an enable signal to stop driving of the motor based on a result of comparing a measured level of the current with the preset reference value related to a point in time when the paper reaches and contacts the feed roller and then stops.

17. The image forming apparatus as claimed in claim 16, wherein
    the sensor outputs a sensed voltage in response to the current measured, and
    the interceptor outputs the enable signal based on a comparison of the sensed voltage and a preset reference voltage.

18. The image forming apparatus as claimed in claim 17, wherein the interceptor comprises:
    a low pass filter to receive the sensed voltage; and
    a comparator to receive the sensed voltage from the low pass filter and compare the sensed voltage to the preset voltage.

19. The image forming apparatus as claimed in claim 16, further comprising:
    a controller configured to also control driving of the motor according to a measured level of the current.

20. The image forming apparatus as claimed in claim 19, further comprising:
    a driver to receive the enable signal from the interceptor to stop the driving of the motor and/or receive a pulse width modulation signal from the controller to control the driving of the motor.

* * * * *